United States Patent [19]

Nakayama

[11] Patent Number: 4,528,934
[45] Date of Patent: Jul. 16, 1985

[54] THIN-FILM COATING APPARATUS

[75] Inventor: Muneo Nakayama, Tokyo, Japan

[73] Assignee: Tokyo Denshi Kagaku Kabushiki Kaisha, Kanagawa, Japan

[21] Appl. No.: 524,605

[22] Filed: Aug. 19, 1983

Related U.S. Application Data

[63] Continuation-in-part of Ser. No. 347,798, Feb. 11, 1982, abandoned.

[30] Foreign Application Priority Data

Feb. 16, 1981 [JP] Japan ............................... 56-21674

[51] Int. Cl.³ ............................................. B05C 11/08
[52] U.S. Cl. ....................................... 118/52; 118/326
[58] Field of Search ................... 118/52, 53, 54, 302, 118/321, 326; 427/240

[56] References Cited

U.S. PATENT DOCUMENTS 1,746,228  2/1930  Darling ............................... 118/302
3,538,883  11/1970 Polin ................................. 118/52 X
4,290,348  9/1981  Morgan et al. ............... 118/DIG. 7

FOREIGN PATENT DOCUMENTS 53-72464  6/1978  Japan .................................. 118/52

Primary Examiner—John P. McIntosh
Attorney, Agent, or Firm—Irving M. Weiner; Pamela S. Burt

[57] ABSTRACT

A thin-film coating apparatus comprising a device for applying in a dropwise manner a film-forming coating solution onto a material to be treated, a spinner adapted to rotate the material, a casing for enclosing the material, and a wall surface provided within the casing such that the wall surface faces the material, the wall surface being wet with a solvent for a solute of the coating solution. The apparatus is effective in applying a high-quality uniform coating film at a high speed, thereby facilitating the mass-production of thin-film coated materials or articles.

17 Claims, 8 Drawing Figures

THIN-FILM COATING APPARATUS

This is a continuation-in-part of application Ser. No. 347,798 filed Feb. 11, 1982, now abandoned.

BACKGROUND OF THE INVENTION

1. Field of the Invention

The present invention relates to a thin-film coating apparatus, and more particularly to a thin-film coating apparatus of a type in which a film-forming coating solution is applied in a dropwise manner onto the surface of a material to be treated, and is spread by rotating the material to provide a thin film coating thereon.

2. Description of Relevant Art

In a known type of thin-film coating apparatus, a coating solution is dropped onto the surface of a material to be treated such as a metal plate, glass plate, ceramic plate, printed circuit board, semiconductor wafer or the like, and the material is then rotated by employing a spinner. An exemplary apparatus for providing a coating of a photoresist or diffusion source for semiconductors on a surface of a semiconductive wafer is illustrated in FIG. 8 of the accompanying drawings.

With reference to FIG. 8, the coating apparatus comprises a casing 101, a spinner shaft 103 rotatably supported on a bottom wall 102 of the casing 101, a spinner head 104 provided on the spinner shaft 103 and a nozzle 105 disposed above the spinner shaft 103 and adapted to drop a coating solution. A through-hole is formed through both the spinner shaft 103 and the spinner head 104. By connecting the through-hole for communication with a vacuum pump, a wafer 106 mounted on the spinner head 104 can be closely attached to the spinner head 104, so that the spinner head 104 and wafer 106 rotate as an integral unit.

When the coating solution is applied in a dropwise manner from the nozzle 105 onto the wafer 106 and the wafer 106 is rotated at a high speed, a part of the thus applied coating solution is uniformly radially spread on the surface of the wafer 106 by virtue of centrifugal forces. A major portion of the thus applied coating solution does not take part in the formation of a coating film, but rather flies off from the surface of the wafer 106. It then hits the inner peripheral wall of the casing 101, flows down along the wall surface, and is finally collected through a drainage opening 107.

Such conventional apparatus is generally provided with a device which evacuates the casing to prevent the flying particles of coating solution from sticking to the surface of a wafer being treated. Therefore, the interior of the apparatus is kept at a reduced pressure. On the other hand, convection occurs in the apparatus because the spinner head and wafer are rotated at a high speed. Accordingly, the atmosphere within the casing promotes volatization of the solvent, resulting in accelerated evaporation of the solvent from the coating solution.

Due to such accelerated evaporation, the solvent evaporates easily from the coating solution which is flowing down along the wall surface of the casing, thereby causing its solute to be deposited and become stuck to the wall surface of the casing or the like. If the deposit of the solute is accumulated there, pieces of the solute are blown upwardly so as to stick to a wafer being treated, with the result that the coated film develops pin holes, includes projections made of pieces of the solute, and/or becomes uneven, thereby leading to a lowered product yield.

Heretofore, in order to overcome the aforesaid disadvantages, the wall surface has been wiped with sponge, cloth, filter paper or the like, which may optionally be impregnated with a solvent; the wall portion of the casing has been disassembled and washed; or a lining such as an aluminum foil or a film sheet has been applied on the wall surface of the casing.

However, the above solutions have been totally dependent on manual work, and impede any speed-up of the coating step. In addition, the manual work prevents carrying out of the coating step and its preceding and subsequent steps as a series of continuous operations, thereby hampering the automation of the overall coating operation. Thus, such conventional solutions are disadvantageous from the standpoint of production efficiency.

The present invention effectively overcomes the above-described disadvantages attendant the conventional techniques.

SUMMARY OF THE INVENTION

The present invention provides a thin-film coating apparatus which comprises means for applying in a dropwise manner a film-forming coating solution onto a material to be treated, a spinner adapted to rotate the material, a casing for enclosing the material, and a wall surface provided within the casing such that the wall surface faces the material, the wall surface being wet with a solvent for a solute of the coating solution.

An object of the present invention is to provide a thin-film coating apparatus which suppresses deposition of the solute from a coating solution to prevent the formation of pin holes and/or projections in the resulting film, thereby making it possible to mass-produce uniform coating films at a high speed.

The above and further objects, details and features of the present invention will become apparent from the following detailed description of preferred embodiments, when read in conjunction with the accompanying drawings.

DETAILED DESCRIPTION OF PREFERRED EMBODIMENTS

Figure 1:
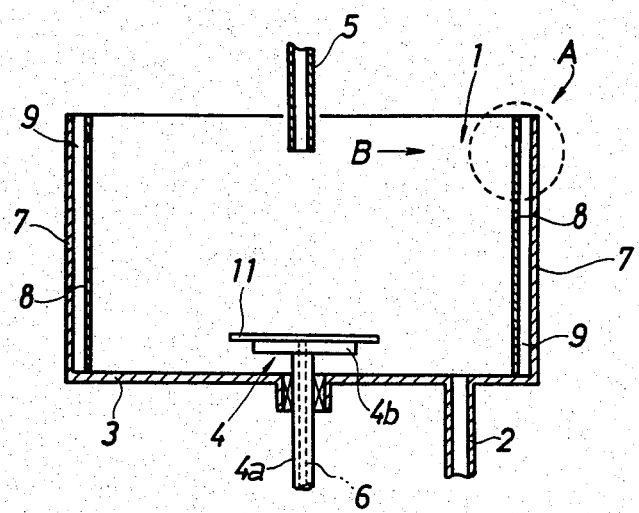
FIG. 1 is a vertical cross-sectional side view of a thin-film coating apparatus in accordance with a first embodiment of the present invention.

With reference to FIG. 1, the thin-film coating apparatus in accordance with the present invention includes a substantially cylindrical casing 1, which is open at the top thereof but is closed at the bottom thereof by means of a bottom wall 3 provided with a drain pipe 2 having a cock. Disposed at a lower central location within the casing 1 is a spinner 4, and substantially immediately above the spinner 4 there is provided a nozzle 5 for dropping a coating solution. The spinner 4 comprises a spinner shaft 4a rotatably supported on the bottom wall 3 and a spinner head 4b formed as an integral part on the upper extremity of the shaft 4a. A through-hole 6 is formed in the shaft 4a and head 4b, and is connected so as to communicate with a vacuum pump (not shown). A material 11 to be treated (for example, a disc-shaped semiconductor wafer) is then mounted on the head 4b and, making use of a suction force of the vacuum pump, the material 11 is firmly attached to the head 4b without applying any undue force thereto. Thereafter, a coating solution obtained by dissolving components of an intended thin-film, which is to be applied onto the material 11, in a volatile solvent is dropped in a suitable amount onto a central part of the material 11 from the nozzle 5. The material 11 and head 4b are then rotated at a high speed, thereby spreading the coating solution radially by virtue of centrifugal forces and providing a uniform coating of the thin-film on the material 11.

Figure 2:
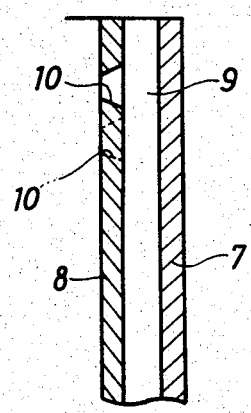
FIG. 2 is an enlarged view of an important part A of the apparatus of FIG. 1.
Figure 3:
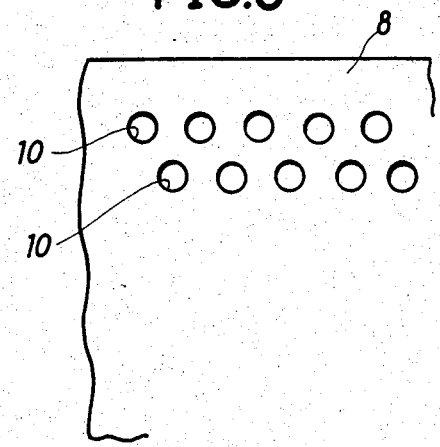
FIG. 3 is an enlarged view of the important part A of the apparatus of FIG. 1, taken in the direction indicated by arrow B in FIG. 1.

Within the casing 1 there is provided a substantially cylindrical baffle member 8 with a suitable space 9 defined between the member 8 and side wall 7. The space 9 is filled with a suitable solvent for the solute contained in the coating solution. As shown in FIGS. 2 and 3, the baffle member is provided with a number of fine apertures 10 formed at the upper part of baffle member 8 for causing the solvent to ooze out therethrough. The fine apertures 10 are staggered horizontally and vertically. Although in the illustrated embodiment the fine apertures 10 are formed at the upper part of the baffle member 8, they may alternatively be formed throughout the baffle plate 8 in substantially its entirety.

Splashing of the coating solution from the material 11 sticks mostly to the inner wall of the baffle member 8. However, due to the solvent which normally oozes out through the fine apertures 10, the thus stuck coating solution is washed downwardly toward the bottom wall 3 before the solute in the thus-stuck coating solution becomes deposited, and is then discharged outside through the drain pipe 2.

Figure 4:
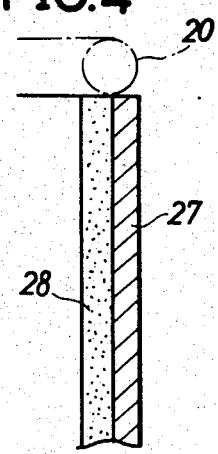
FIG. 4 is a fragmentary vertical cross-sectional side view of a thin-film coating apparatus according to a second embodiment of the present invention.

FIG. 4 illustrates a second embodiment of the present invention wherein a porous material such as sponge or cancellous material is used in place of the baffle member 8 defining the above-described apertures. Over the entire inner surface of a side wall 27 of a casing of a spinner (not shown) there is applied a sponge or similar cancellous material 28. By impregnating a solvent for the solute of a coating solution into the sponge 28 from suitable upper locations, for example, through apertures formed in a pipe 20 which is provided along the upper extremity of the casing, the solvent is caused to ooze out onto the inner peripheral surface formed by the sponge 28, thereby washing the stuck coating solution downwardly.

Figure 5:
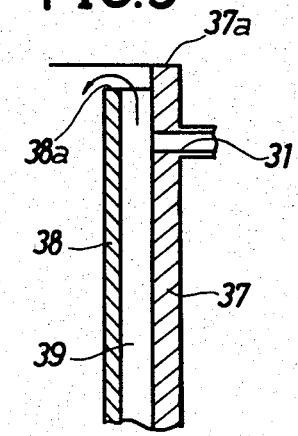
FIG. 5 is a fragmentary vertical cross-sectional side view of a thin-film coating apparatus in accordance with a third embodiment of the present invention.

FIG. 5 illustrates a third embodiment of the present invention wherein the solvent is caused to overflow from upper locations instead of being oozed out. A baffle member 38 is provided with a space 39 defined between the baffle member 38 and the inner peripheral wall of a side wall 37 of the casing for a spinner (not shown) so as to keep the solvent in the space 39. The upper extremity 38a of the baffle member 38 is disposed somewhat lower than the upper extremity 37a of the side wall 37. The solvent is supplied into the space 39 from a solvent-feeding hole 31 formed at the upper part of the side wall 37 to fill up the space 39 with the solvent. Then, the solvent is caused to overflow from the upper extremity 38a as indicated by the arrow, thereby keeping the inner peripheral surface of the baffle member 38 wet.

Figure 6:
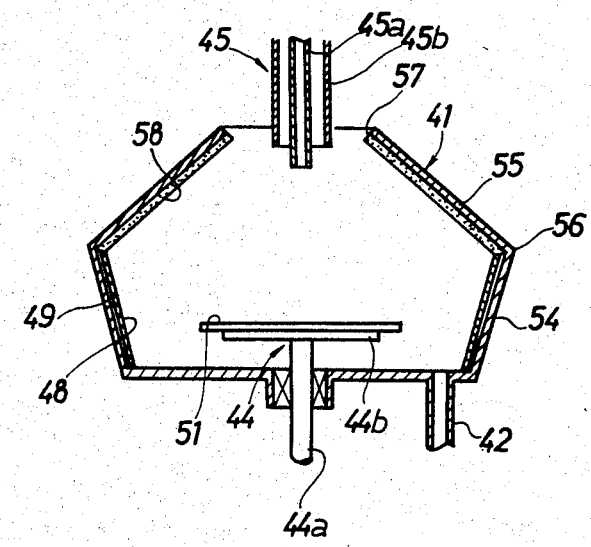
FIG. 6 is a vertical cross-sectional side elevational view of a thin-film coating apparatus according to a fourth embodiment of the present invention.

FIG. 6 shows a fourth embodiment of the present invention. A casing 41 of the thin-film coating apparatus has an upper end opening 57 of a relatively small diameter and an intermediate portion 56 of a relatively large diameter, so as to be thus formed into an intermediately expanded configuration which enables confinement of the vaporized solvent in the casing to occur to a higher degree, thereby preventing undesirable deposition of the solute in the apparatus more reliably. The upper half portion 55 and lower half portion 54 of casing 41 are divisibly detachable. On the inner face of the upper half portion 55 there is applied a sponge material 58 similar to that described with reference to FIG. 4, while a baffle member 48, which is similar to that described with reference to FIG. 2, is disposed inside the lower half portion 54 with a space defined between the baffle member 48 and the lower half portion 54.

In the embodiment shown in FIG. 6, there is provided a nozzle 45 particularly formed into a double-walled pipe structure, which comprises an inner pipe 45a and an outer pipe 45b. A solvent is supplied to the free end portion of the inner pipe 45a from the outer pipe 45b, thereby preventing the solute of a coating solution from depositing at the free end portion of the inner pipe 45a or the supplied coating solution from being concentrated there.

Figure 7:
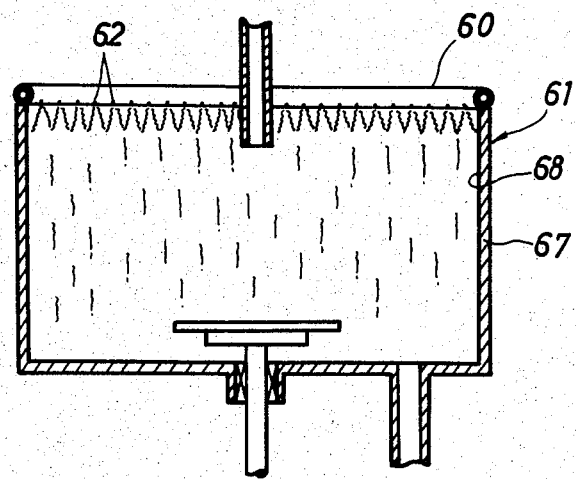
FIG. 7 is a vertical cross-sectional side view of a thin-film coating apparatus according to a fifth embodiment of the present invention.
Figure 8:
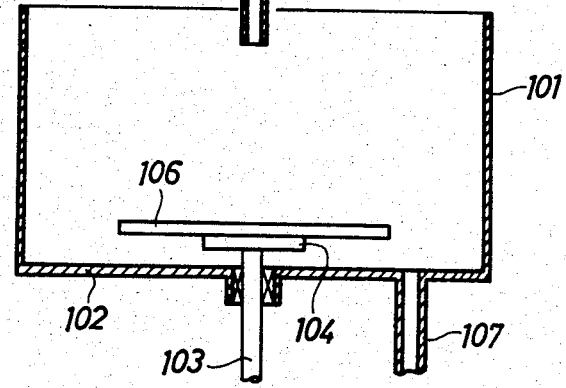
FIG. 8 is a vertical cross-sectional side view of a conventional thin-film coating apparatus.

FIG. 7 shows a fifth embodiment of the present invention. Along the upper extremity of a casing 61 of substantially the same configuration as that described with reference to the first embodiment, there is provided a pipe 60 which is similar to that illustrated in FIG. 4. A solvent is fed into the pipe 60. A number of apertures 62 for discharging the solvent therethrough are formed at a bottom portion of the pipe 60 in the lengthwise direction of the pipe 60 at suitable intervals. The solvent is normally caused to flow down through each aperture 62 along an inner peripheral surface 68 of a side wall 67 having a certain width. It is preferable to provide the apertures 62 rather close to one another so that the width of the quantity of solvent discharged from each aperture overlaps on the inner peripheral surface 68 with the widths of the solvent discharged from adjacent apertures. By way of example, the intervals between adjacent apertures may be less than 25 mm and the rate of discharge of the solvent may be within 3–150 ml/minute.

Due to the construction of the thin-film coating apparatus as described above, the coating solution is spread radially by virtue of centrifugal forces and is uniformly coated on the surface of the material during the coating treatment in which the disc-shaped material is mounted on and firmly attached to a spinner head, the coating solution is applied in a dropwise manner onto a central part of the material and a spinner is rotated at a high speed about its shaft.

Although a major portion of the coating solution flies off from the material during the coating treatment, it is effectively caught by the baffle member, sponge and side wall of the casing. In addition, the atmosphere within the casing 41 tends to remain stable. Because the solvent is caused to ooze out onto the inside surfaces, the coating solution is promptly washed away without sticking to those surfaces and is then discharged through the drain pipe.

Thin-film coating apparatus according to the above-described embodiments of the invention are particularly suitable for dropping and coating a photoresist or a diffusion source-containing coating solution onto a semiconductor wafer. It should be understood, however, that the present invention is not limited to such application, and may be extensively used for any apparatus for forming a film on a material to be treated by using a spinner. Further, the baffle member such as sponge or the like may be applied not only to the side wall of the spinner casing but also, for example, to the bottom wall of the same spinner casing.

Any desired solvent may be employed for implementing the present invention, provided that it can dissolve the solute in the coating solution. A washing solvent employed as a solvent in preparing the coating solution is especially preferable inasmuch as no adverse affect will result to the coating film.

According to the invention, the solvent may be continuously fed or, alternatively, may be intermittently oozed out or overflown onto the inner peripheral surface of the wall member in accordance with the cycle of the coating step. The invention further contemplates that the flow rate of the solvent may be controlled by means of a regulator incorporated within the solvent-feeding system.

As will be understood from the foregoing description of the invention, a wall surface provided in a face-to-face relationship with a material being subjected to a coating treatment within a thin-film coating apparatus enables a solvent to ooze out or overflow onto the wall surface, the apparatus being adapted to form a uniform coating film by centrifugal forces by mounting and closely attaching the material to a spinner, applying a coating solution in a dropwise manner onto the surface of the material and then rotating the material at a high speed on the spinner. Thus, any coating solution which sticks to the wall surface can be promptly washed away and the interior of the apparatus is filled with vaporized solvent approximately to the saturation point thereof, thereby preventing undesirable deposition of the solute in the apparatus.

The apparatus according to the present invention is free from any potential danger of a solute sticking to the surface of a material undergoing coating treatment. This enables the attainment of a uniform coating film of good quality which is free of pin holes, projections or other defects, leading to an improved product yield. The time-consuming and troublesome conventional wiping work, which is dependent on manual operations, is rendered unnecessary, thereby making it possible to provide automation of the coating process by carrying out the coating step and its preceding and subsequent steps as a series of continuous operations and contributing to considerable improvement in production efficiency. Moreover, the aforesaid advantages are attained with a simplified and inexpensive structure wherein wall means is provided inside the side wall of a spinner casing to supply a solvent.

Although there have been described what are at present considered to be the preferred embodiments of the invention, it will be understood that the invention may be embodied in other specific forms without departing from the spirit or essential characteristics thereof. The present embodiments are therefore to be considered in all respects as illustrative, and not restrictive. The scope of the invention is indicated by the appended claims rather than by the foregoing description.

I claim:

1. An apparatus for coating a material with a thin film of photoresist, comprising:
   a casing having a bottom wall;
   a spinner adapted to rotate a material to be treated, said spinner being operably disposed within said casing;
   first means for applying in a dropwise manner a photoresist coating solution onto said material to be treated, said first means being disposed above said spinner;
   a wall surface provided within said casing such that said wall surface faces said material mounted on said spinner;
   second means for supplying said wall surface with a solvent for a solute of said coating solution, at a rate of discharge within 3–150 ml per minute, such that said solvent washes said coating solution away from said wall surface; and
   drain means for discharging said solvent which has dissolved said solute, said drain means being provided through said bottom wall.

2. An apparatus in accordance with claim 1, wherein: said second means is adapted to cause said solvent to flow down along said wall surface.

3. An apparatus in accordance with claim 2, wherein: said second means is adapted to cause said solvent to ooze out onto said wall surface.

4. An apparatus in accordance with claim 2, wherein: said second means is adapted to cause said solvent to overflow from substantially the upper extremity of said wall surface.

5. An apparatus in accordance with claim 2, wherein: an inner surface of a baffle member defines said wall surface and is disposed such that a space is defined between said baffle member and said casing, said space being substantially filled with said solvent.

6. An apparatus in accordance with claim 2, wherein: an inner surface of a porous covering member is applied on the inner surface of said casing so as to define said wall surface.

7. An apparatus in accordance with claim 2, wherein: said wall surface comprises the inner surface of said casing.

8. An apparatus in accordance with claim 1, wherein: an inner surface of a baffle member defines said wall surface and is disposed such that a space is defined between said baffle member and said casing, said space being substantially filled with said solvent.

9. An apparatus in accordance with claim 8, wherein: said baffle member is provided with a plurality of substantially fine through-apertures formed in at least the upper portion thereof.

10. An apparatus in accordance with claim 8, wherein: the upper extremity of said baffle member is at least partially lower than the upper extremity of said casing.

11. An apparatus in accordance with claim 1, wherein:
an inner surface of a porous covering member applied on the inner surface of said casing defines said wall surface.

12. An apparatus in accordance with claim 11, wherein:
said casing is divisible into an upper half portion and a lower half portion.

13. An apparatus in accordance with claim 12, wherein:
said wall surface comprises the inner surface of said porous covering member at a location corresponding to said upper half portion and the inner surface of a baffle member at a location corresponding to said lower half portion; and
said baffle member has a number of substantially fine through-apertures formed therein.

14. An apparatus in accordance with claim 1, wherein:
said wall surface comprises the inner surface of said casing.

15. An apparatus in accordance with claim 14, wherein:
said second means comprises pipe means disposed at the upper extremity of said casing and adapted to introduce said solvent thereinto, with a plurality of apertures being formed at predetermined intervals through the bottom part of said pipe means so as to cause said solvent to flow down along said wall surface.

16. An apparatus in accordance with claim 1, wherein:
said casing has a relatively small diameter at an upper end opening thereof and a relatively large diameter at the intermediate part thereof, thereby defining an intermediately expanded configuration; and
said casing is adapted to substantially confine said solvent in its vaporized state to thereby increase the density thereof.

17. An apparatus in accordance with claim 1, wherein:
said casing is adapted to substantially confine said solvent in its vaporized state to thereby increase the density thereof.

* * * * *